(12) United States Patent
Hoshi et al.

(10) Patent No.: US 10,103,229 B2
(45) Date of Patent: Oct. 16, 2018

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventors: Yasuyuki Hoshi, Nagano (JP); Yuichi Harada, Nagano (JP); Takashi Shiigi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 35 days.

(21) Appl. No.: 15/291,297

(22) Filed: Oct. 12, 2016

(65) Prior Publication Data

US 2017/0110544 A1 Apr. 20, 2017

(30) Foreign Application Priority Data

Oct. 19, 2015 (JP) .................................. 2015-205336

(51) Int. Cl.
*H01L 29/66* (2006.01)
*H01L 29/16* (2006.01)
(Continued)

(52) U.S. Cl.
CPC .... *H01L 29/1608* (2013.01); *H01L 21/02529* (2013.01); *H01L 21/76895* (2013.01); *H01L 21/823807* (2013.01); *H01L 23/535* (2013.01); *H01L 24/26* (2013.01); *H01L 27/092* (2013.01); *H01L 29/0649* (2013.01); *H01L 29/2003* (2013.01); *H01L 29/36* (2013.01); *H01L 29/66712* (2013.01); *H01L 29/7805* (2013.01); *H01L 29/8611* (2013.01)

(58) Field of Classification Search
CPC ......... H01L 29/66712; H01L 21/76895; H01L 23/535; H01L 29/41741
See application file for complete search history.

(56) References Cited

U.S. PATENT DOCUMENTS 9,997,603 B2 * 6/2018 Hoshi .................. H01L 21/0465
2015/0115285 A1 * 4/2015 Kinoshita ............. H01L 29/872
257/77

FOREIGN PATENT DOCUMENTS

JP 2014-99444 A 5/2014

OTHER PUBLICATIONS

K. Shenai et al., "Optimum Semiconductors for High-Power Electronics," IEEE Transactions on Electron Devices, Sep. 1989, vol. 36, No. 9, p. 1811-1823.

(Continued)

*Primary Examiner* — William F Kraig
*Assistant Examiner* — Khatib Rahman
(74) *Attorney, Agent, or Firm* — Chen Yoshimura LLP

(57) ABSTRACT

A semiconductor device includes a wide-bandgap semiconductor substrate of a first conductivity type, a wide-bandgap semiconductor deposition layer of the first conductivity type, semiconductor regions of a second conductivity type, a wide-bandgap semiconductor layer of the second conductivity type, first regions of the first conductivity type, and second regions of the first conductivity type. The width w of a plating film formed on a source electrode of the semiconductor device is greater than or equal to 10 μm. Beneath the plating film, the wide-bandgap semiconductor layer is formed on the surface of one of the semiconductor regions of the second conductivity type.

5 Claims, 5 Drawing Sheets

(51) Int. Cl.
    *H01L 21/02*      (2006.01)
    *H01L 21/768*     (2006.01)
    *H01L 21/8238*    (2006.01)
    *H01L 23/535*     (2006.01)
    *H01L 27/092*     (2006.01)
    *H01L 29/06*      (2006.01)
    *H01L 29/36*      (2006.01)
    *H01L 23/00*      (2006.01)
    *H01L 29/78*      (2006.01)
    *H01L 29/20*      (2006.01)
    *H01L 29/861*     (2006.01)

(56) References Cited

OTHER PUBLICATIONS

B. Jayant Baliga, "Silicon Carbide Power Devices," (US), World Scientific Publishing Co., Mar. 30, 2006, p. 61.

* cited by examiner

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing the semiconductor device.

Background Art

Silicon (Si) has conventionally been used as the material for power semiconductor devices for controlling high voltages and high currents. There are various types of power semiconductor devices, such as bipolar transistors, insulated-gate bipolar transistors (IGBTs), and metal-oxide-semiconductor field-effect transistors (MOSFETs), and these devices are used for different purposes according to the use case.

For example, bipolar transistors and IGBTs have a higher current density than MOSFETs and make it possible to work with higher currents but cannot be switched at high speeds. More specifically, bipolar transistors are limited to being used at switching frequencies on the order of several kHz, and IGBTs are limited to being used at switching frequencies on the order of several dozen kHz. Power MOSFETs, on the other hand, have a lower current density than bipolar transistors and IGBTs and make it difficult to work with high currents but can be operated at high switching speeds on the order of several MHz.

However, there is strong commercial demand for power semiconductor devices that can both handle large currents and offer good high speed performance. Much effort has been focused on improving IGBTs and power MOSFETs, and currently, these devices have been developed to near the performance limits of the materials being used. There is various ongoing research on semiconductor materials that can replace silicon in power semiconductor devices, and silicon carbide (SiC) has attracted attention as a semiconductor material that could potentially make it possible to manufacture next-generation power semiconductor devices with low on-voltages and excellent high speed and high temperature performance (see Non-Patent Document 1).

Silicon carbide is a semiconductor material with exceptional chemical stability that also has a wide bandgap of 3 eV and can be used as a semiconductor in an extremely stable manner even at high temperatures. Moreover, silicon carbide has a maximum field strength of at least an order of magnitude greater than that of silicon and therefore shows potential as a semiconductor material that could make it possible to make the on-resistance of a device sufficiently small. These advantageous properties of silicon carbide are also exhibited by other wide-bandgap semiconductors that have a wider bandgap than silicon, such as gallium nitride (GaN). Therefore, using wide-bandgap semiconductors will make it possible to increase the breakdown voltage of semiconductor devices (see Non-Patent Document 2, for example).

Due to the reduction in incurred losses that comes with using silicon carbide in high breakdown voltage semiconductor devices, using such devices in an inverter makes it possible to operate at carrier frequencies an order of magnitude greater than with conventional semiconductor devices made using silicon. Operating a semiconductor device at high frequencies increases the temperature of the chip due to the resulting heat generation and affects the reliability of the semiconductor device. Particularly in a semiconductor device in which bonding wires are bonded to a front surface electrode on the front surface side of a substrate as a wiring material for extracting voltage from the front surface electrode to outside of the device, when the device is used at high temperatures, the adhesion between the front surface electrode and the bonding wires decreases, thereby affecting the reliability of the device.

There are also technologies in which sheet-shaped conductors are used as a wiring material other than bonding wires for extracting voltage from the front surface electrode to outside of the device (see Patent Document 1, for example).

Furthermore, there are conventional silicon carbide semiconductor devices in which pin electrodes are bonded to the front surface electrode with solder in order to reduce any decrease in adhesion between the front surface electrode and the bonding wires. FIG. 5 is a cross-sectional view illustrating a configuration of a conventional silicon carbide semiconductor device. An n-type silicon carbide epitaxial layer 2 is deposited onto the surface of an $n^+$ silicon carbide substrate 1, and a plurality of $p^+$ regions 10 are formed in the surface of the n-type silicon carbide epitaxial layer 2. A p-type silicon carbide epitaxial layer 11 is formed on the surfaces of the $p^+$ regions 10. n-type well regions 12 are formed in the p-type silicon carbide epitaxial layer 11 on the n-type silicon carbide epitaxial layer 2 in areas in which the $p^+$ regions 10 are not formed. $n^+$ source regions 4 and $p^{++}$ contact regions 5 are formed in the surface of the p-type silicon carbide epitaxial layer 11.

Gate electrodes 7 are formed on the surface of the portions of the p-type silicon carbide epitaxial layer 11 that are sandwiched between the $n^+$ source regions 4 and the n-type well regions 12, with a gate insulating film 6 interposed therebetween. An interlayer insulating film 14 is selectively formed on the gate electrodes 7. A source electrode 8 is formed over the surfaces of the $n^+$ source regions 4 and the $p^{++}$ contact regions 5. A protective film 15 is selectively formed on the source electrode 8, and a plating film 16 is formed in the areas in which the protective film 15 is not formed.

A second protective film 17 is formed covering the portions where the plating film 16 and the protective film 15 are adjacent to one another. A pin electrode 18 is formed connected to the plating film 16 via solder 19. A drain electrode 9 is formed on the rear surface side of the $n^+$ silicon carbide substrate 1.

In the MOSFET structure illustrated in FIG. 5, when a positive voltage relative to the source electrode 8 is applied to the drain electrode 9 and a voltage less than the gate threshold value is applied to the gate electrodes 7, the p-n junctions between the p-type silicon carbide epitaxial layer 11 and the n-type well regions 12 become reverse biased, and current does not flow because the breakdown voltage of the active regions is maintained. Meanwhile, when a voltage greater than or equal to the gate threshold value is applied to the gate electrodes 7, current flows due to the formation of inversion layers in the surface of the p-type silicon carbide epitaxial layer 11 directly beneath the gate electrodes 7, therefore making it possible to switch the MOSFET ON and OFF according to the voltage applied to the gate electrodes 7.

RELATED ART DOCUMENTS

Patent Documents

Patent Document 1: Japanese Patent Application Laid-Open Publication No. 2014-99444

Non-Patent Documents

Non-Patent Document 1: K. Shenai et al., "Optimum Semiconductors for High-Power Electronics," IEEE Transactions on Electron Devices, September 1989, Vol. 36, No. 9, p. 1811-1823

Non-Patent Document 2: B. Jayant Baliga, "Silicon Carbide Power Devices," (US), World Scientific Publishing Co., Mar. 30 2006, p. 61

SUMMARY OF THE INVENTION

However, in this conventional structure, the source electrode 8 is formed on the interlayer insulating film 14 that covers the gate electrodes 7, and therefore level differences 21 in the source electrode 8 occur between portions in which the source electrode 8 covers the gate electrodes 7 and portions in which the source electrode 8 does not cover the gate electrodes 7. As a result, when the pin electrode 18 is soldered to the source electrode 8 with the plating film 16 interposed therebetween, concentrated stress is applied to the portions of the level differences 21 in the source electrode 8 that are directly beneath the triple point portions at which the plating film 16, the protective film 15, and the source electrode 8 contact one another. Here, these level differences 21 in the source electrode 8 refer to the differences in height from the surface of the n$^+$ silicon carbide substrate 1 at these bump-shaped portions. More specifically, the level differences 21 in the source electrode 8 are the differences in height between the portions in which the source electrode 8 covers the gate electrodes 7 and the portions in which the source electrode 8 does not cover the gate electrodes 7.

Moreover, the differences in temperature in the areas around the solder 19 increase when the pin electrode 18 is soldered and when switching the semiconductor device. As a result, stress due to thermal expansion is concentrated near the edges of the solder 19 and more particularly at the portions of the level differences 21 in the source electrode 8 that are directly beneath the triple point portions at which the plating film 16, the protective film 15, and the source electrode 8 contact one another.

This concentration of stress at these portions of the level differences 21 in the source electrode 8 can cause cracking, which can degrade the performance and decrease the reliability of the semiconductor device. Even when cracking does not occur, the microcurrent threshold voltage may fluctuate due to this applied stress. This can make it easier for current to flow and cause local increases in current density, which also decrease the reliability of the semiconductor device.

The present invention aims to provide a semiconductor device and a method of manufacturing the semiconductor device that improve the reliability of a semiconductor device that includes a pin electrode bonded with solder. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a wide-bandgap semiconductor substrate of a first conductivity type made of a semiconductor having a wider bandgap than silicon; a wide-bandgap semiconductor deposition layer of the first conductivity type that is deposited on a front surface of the wide-bandgap semiconductor substrate and that has a lower impurity concentration than the wide-bandgap semiconductor substrate; a semiconductor region of a second conductivity type that is selectively formed in a surface layer of the wide-bandgap semiconductor deposition layer on a side opposite to the wide-bandgap semiconductor substrate; a wide-bandgap semiconductor layer of the second conductivity type that is made of a semiconductor having a wider bandgap than silicon and that is formed on surfaces of the wide-bandgap semiconductor deposition layer and the semiconductor region of the second conductivity type; a first region of the first conductivity type selectively formed in a portion of the wide-bandgap semiconductor layer that is above the deposition layer; a second region of the first conductivity type that is selectively formed in the wide-bandgap semiconductor layer; a gate electrode formed on a surface of a portion of the wide-bandgap semiconductor layer that is sandwiched between the second region of the first conductivity type and the first region of the first conductivity type; a gate insulating film interposed between the gate electrode and the wide-bandgap semiconductor layer; a source electrode that contacts the wide-bandgap semiconductor layer and the second region of the first conductivity type; an interlayer insulating film that covers the gate electrode; a drain electrode formed on a rear surface of the wide-bandgap semiconductor substrate; a plating film selectively formed on the source electrode; and a pin electrode that is connected to the plating film via solder, wherein a width of the plating film in a direction parallel to the wide-bandgap semiconductor substrate is greater than or equal to 10 μm, and wherein the second region of the first conductivity type and the first region of the first conductivity type are not formed in a portion of the wide-bandgap semiconductor layer facing the plating film.

Moreover, in the semiconductor device according to one aspect of the present invention as described above, the source electrode may have a bump-shaped portion, and a difference in height, from the front surface of the wide-bandgap semiconductor substrate, of the bump-shaped portion may be less than or equal to 2 μm.

Moreover, in the semiconductor device according to one aspect of the present invention as described above, the interlayer insulating film may be covered by a nitride film.

In addition, in the semiconductor device according to one aspect of the present invention as described above, the source electrode may be selectively covered by a nitride film.

In another aspect, the present disclosure provides a method of manufacturing a semiconductor device, including: forming, on a front surface of a wide-bandgap semiconductor substrate of a first conductivity type made of a semiconductor having a wider bandgap than silicon, a wide-bandgap semiconductor deposition layer of the first conductivity type that has a lower impurity concentration than the wide-bandgap semiconductor substrate; selectively forming, in a surface layer of the wide-bandgap semiconductor deposition layer, a semiconductor region of a second conductivity type; forming, on surfaces of the wide-bandgap semiconductor deposition layer, a wide-bandgap semiconductor layer of the second conductivity type that is made of a semiconductor having a wider bandgap than silicon; selectively forming, in a portion of the wide-bandgap semiconductor layer that is above the deposition layer, a first region of the first conductivity type; selectively forming a second region of the first conductivity type in the wide-bandgap semiconductor layer; forming a gate electrode on a surface of a portion of the wide-bandgap semiconductor layer that is sandwiched between the second region of the first conductivity type and the first region of the first conductivity type, forming a gate insulating film between the gate electrode and the wide-bandgap semiconductor layer; forming a source electrode that contacts the wide-bandgap semiconductor layer and the second region of the first conductivity type; forming an interlayer insulating film that covers the gate electrode; forming a drain electrode on a rear surface of the wide-bandgap semiconductor substrate; selectively forming a plating film on the source electrode; and forming a pin electrode that is connected to the plating film via solder, wherein in the step of forming the plating film, the plating film is formed having a width of greater than or equal to 10 μm in a direction parallel to the wide-bandgap semiconductor substrate, wherein in the step of selectively forming the first region of the first conductivity type, the first region of the first conductivity type is not formed in a portion of the wide-bandgap semiconductor layer that faces the plating film, and wherein in the step of selectively forming the second region of the first conductivity type, the second region of the first conductivity type is not formed in a portion of the wide-bandgap semiconductor layer that faces the plating film.

In one aspect of the invention described above, the width of the plating film formed on the source electrode is set to 10 μm or greater. Beneath the plating film, the first and second regions of the first conductivity type are not formed, and only the $p^{++}$ contact region is formed. Due to this, gate electrodes are not present directly beneath the triple point portions facing the plating film, and therefore no level differences are present in the source electrode. As a result, there are no portions at which stress is concentrated when soldering the pin electrode or when switching the semiconductor device, and therefore no cracking occurs, and the microcurrent threshold voltage does not fluctuate due to such stress. This makes it possible to prevent decreases in the reliability of the semiconductor device.

Moreover, directly beneath the triple point portions, only the $p^{++}$ contact region is formed, and no channels form. Therefore, even if stress gets concentrated and causes cracking, the performance of the semiconductor device does not deteriorate. Furthermore, because no channels form, the microcurrent threshold voltage does not fluctuate due to applied stress even if stress does get concentrated. This makes it possible to prevent decreases in the reliability of the semiconductor device.

Furthermore, the present invention makes it possible to keep the level differences in the source electrode less than or equal to 2 μm, for example. Keeping the level differences in the source electrode small reduces the stress that concentrates at those level differences in the source electrode. Therefore, no cracking occurs, and the microcurrent threshold voltage does not fluctuate due to applied stress. This makes it possible to prevent decreases in the reliability of the semiconductor device.

Moreover, the nitride film has lower water absorptivity than the polyimide protective film. Therefore, forming the nitride film on the interlayer insulating film makes it possible to prevent water from infiltrating into regions near the gate insulating film. This makes it possible to prevent deterioration in performance and decreases in reliability in the semiconductor device.

In addition, although the source electrode is prone to corrosion due to being made of aluminum, partially forming the nitride film on the source electrode makes it possible to prevent water from infiltrating from the source electrode into regions near the gate insulating film. This makes it possible to prevent deterioration in performance and decreases in reliability in the semiconductor device.

The semiconductor device and the method of manufacturing the semiconductor device according to the present invention make it possible to reduce performance deterioration in semiconductor devices as well as provide a semiconductor device with excellent performance.

DETAILED DESCRIPTION OF EMBODIMENTS

Figure 1:
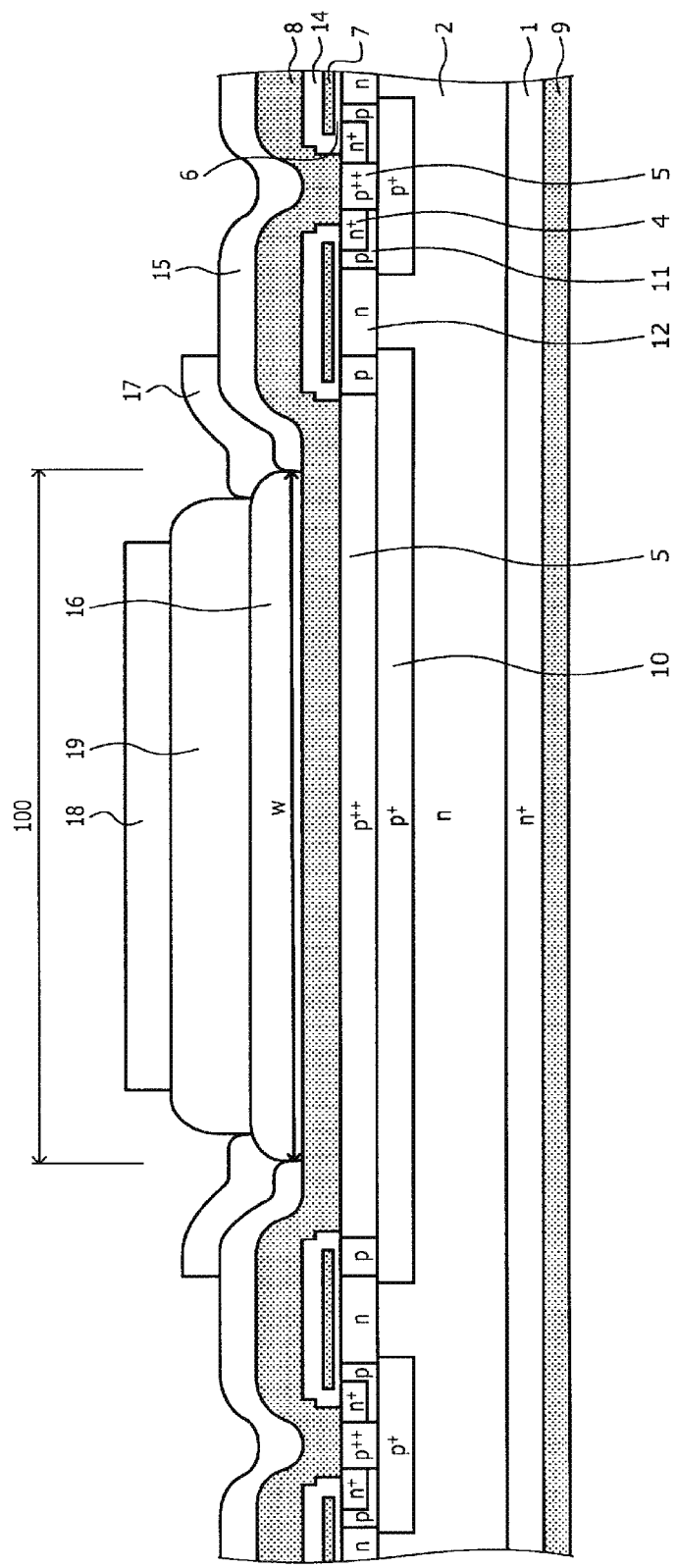
FIG. 1 is a cross-sectional view illustrating a configuration of a silicon carbide semiconductor device according to Embodiment 1.

Preferred embodiments of a semiconductor device and a method of manufacturing the semiconductor device according to the present invention will be described in detail below with reference to figures. In the present specification and the attached drawings, the letters "n" and "p" are used to indicate whether the majority carriers in a layer or region are electrons or holes, respectively. Moreover, the symbols + and − are appended to the letters n and p to indicate layers or regions having a higher or lower density of impurities, respectively, than layers or regions not labeled with the + or − symbols. Layers and regions that are labeled with the same n and p (and + and −) notation have approximately the same impurity concentration but are not limited to having exactly the same impurity concentration. In the descriptions of the embodiments and figures, the same reference characters are used to indicate components that are the same, and duplicate descriptions of the same components are omitted. Moreover, the following notation is used for Miller indices in the present specification: the symbol − indicates a bar to be applied to the index that follows the − symbol; that is, the symbol − is inserted before an index to indicate that that index is negative.

Embodiment 1

The semiconductor device according to at least one aspect of the present invention is formed using a wide-bandgap semiconductor. In Embodiment 1, a silicon carbide semiconductor device manufactured using silicon carbide (SiC) as the wide-bandgap semiconductor, for example, will be described using a MOSFET as an example. FIG. 1 is a cross-sectional view illustrating a configuration of a silicon carbide semiconductor device according to Embodiment 1. FIG. 1 illustrates the state of an active region.

As illustrated in FIG. 1, in the silicon carbide semiconductor device according to Embodiment 1, an n-type silicon carbide epitaxial layer (a wide-bandgap semiconductor deposition layer of a first conductivity type) 2 is deposited onto a first principal surface (the front surface) of an n$^+$ silicon carbide substrate (a wide-bandgap semiconductor substrate of the first conductivity type) 1.

The n$^+$ silicon carbide substrate 1 is a monocrystalline silicon carbide substrate doped with nitrogen (N), for example. The n-type silicon carbide epitaxial layer 2 is a low impurity concentration n-type drift layer doped with nitrogen, for example, and has a lower impurity concentration than the n$^+$ silicon carbide substrate 1. In the following description, the n$^+$ silicon carbide substrate 1 and the n-type silicon carbide epitaxial layer 2 will be referred to collectively as a "silicon carbide semiconductor substrate."

Metal-oxide-semiconductor insulated gate (MOS gate) structures (device structures) are formed on the front surface side of the silicon carbide semiconductor substrate. More specifically, p$^+$ regions (semiconductor regions of a second conductivity type) 10 that function as a p-type base layer are selectively formed in the surface layer of the n-type silicon carbide epitaxial layer 2 on a side opposite to the n$^+$ silicon carbide substrate 1 (that is, on the front surface side of the silicon carbide semiconductor substrate). The p$^+$ regions 10 are doped with aluminum (Al), for example.

A p-type silicon carbide epitaxial layer (a wide-bandgap semiconductor layer of the second conductivity type) 11 is deposited on the surfaces of the n-type silicon carbide epitaxial layer 2 and the p$^+$ regions 10. The p-type silicon carbide epitaxial layer 11 extends from the active region to a breakdown structure (not illustrated in the figure) and is deposited on the breakdown structure as well. The p-type silicon carbide epitaxial layer 11 is doped with aluminum, for example.

Furthermore, n-type well regions (first regions of the first conductivity type) 12 that go through the p-type silicon carbide epitaxial layer 11 in the depth direction and extend into the n-type silicon carbide epitaxial layer 2 are formed in the portions of the p-type silicon carbide epitaxial layer 11 arranged above the n-type silicon carbide epitaxial layer 2. Together, the n-type well regions 12 and the n-type silicon carbide epitaxial layer 2 form a drift region.

n$^+$ source regions (second regions of the first conductivity type) 4 are selectively formed separated from the n-type well regions 12 in the portions of the p-type silicon carbide epitaxial layer 11 that face the p$^+$ regions 10 in the depth direction. p$^{++}$ contact regions 5 are selectively formed between the n$^+$ source regions 4 in the p-type silicon carbide epitaxial layer 11.

Gate electrodes 7 are formed on the surfaces of the portions of the p-type silicon carbide epitaxial layer 11 that are sandwiched between the n$^+$ source regions 4 and the n-type well regions 12, with a gate insulating film 6 interposed therebetween. The gate electrodes 7 may also be formed on the surfaces of the n-type well regions 12 with the gate insulating film 6 interposed therebetween.

An interlayer insulating film 14 is formed covering the gate electrodes 7 on the front surface side of the silicon carbide semiconductor substrate. A source electrode 8 contacts the n$^+$ source regions 4 and the p$^{++}$ contact regions 5 via contact holes formed in the interlayer insulating film 14 and is thereby electrically connected to the n$^+$ source regions 4 and the p$^{++}$ contact regions 5.

The source electrode 8 is electrically insulated from the gate electrodes 7 by the interlayer insulating film 14. A protective film 15 such as a polyimide passivation film is selectively formed on the source electrode 8, for example.

A plating film 16 is formed on the source electrode 8 in areas in which the protective film 15 is not formed. The protective film 15 protects the front surface of the semiconductor device. The protective film 15 also prevents the plating material used for the plating film 16 from flowing into prescribed locations during formation of the plating film 16. Here, "prescribed locations" refers to regions outside of a stress reduction region 100, which will be described later. In addition, the protective film 15 protects an edge termination structure (not illustrated in the figure) that surrounds the periphery of the active region. The protective film 15 also prevents discharge. Furthermore, a drain electrode 9 is formed on the rear surface of the silicon carbide semiconductor substrate. Here, the term "active region" refers to the region through which current flows when the semiconductor device is in the ON state. Moreover, "edge termination structure" refers to a region that is formed surrounding the periphery of the active region and maintains the breakdown voltage of the device by reducing the magnitude of the electric field on the substrate front surface side of the drift layer.

It is preferable that the width w of the plating film 16 be greater than or equal to 10 μm, for example. The plating film 16 provides a region in which to form a pin electrode 18 and has a smaller width than would a region to which bonding wires would be bonded using a wire bonding process. Here, the width w of the plating film 16 refers to the width of the plating film 16 in the direction parallel to the surface of the n$^+$ silicon carbide substrate 1. More specifically, the width w of the plating film 16 refers to the length of the plating film 16 between the triple point portions at which the plating film 16, the protective film 15, and the source electrode 8 contact one another. The region beneath the plating film 16 reduces concentration of stress when soldering and when switching semiconductor device and will therefore be referred to as the "stress reduction region 100" in the following description. Here, "the region beneath the plating film 16" refers to the portion beneath the plating film 16 when the direction going from the plating film 16 towards the n$^+$ silicon carbide substrate 1 is designated as the down direction.

Figure 5:
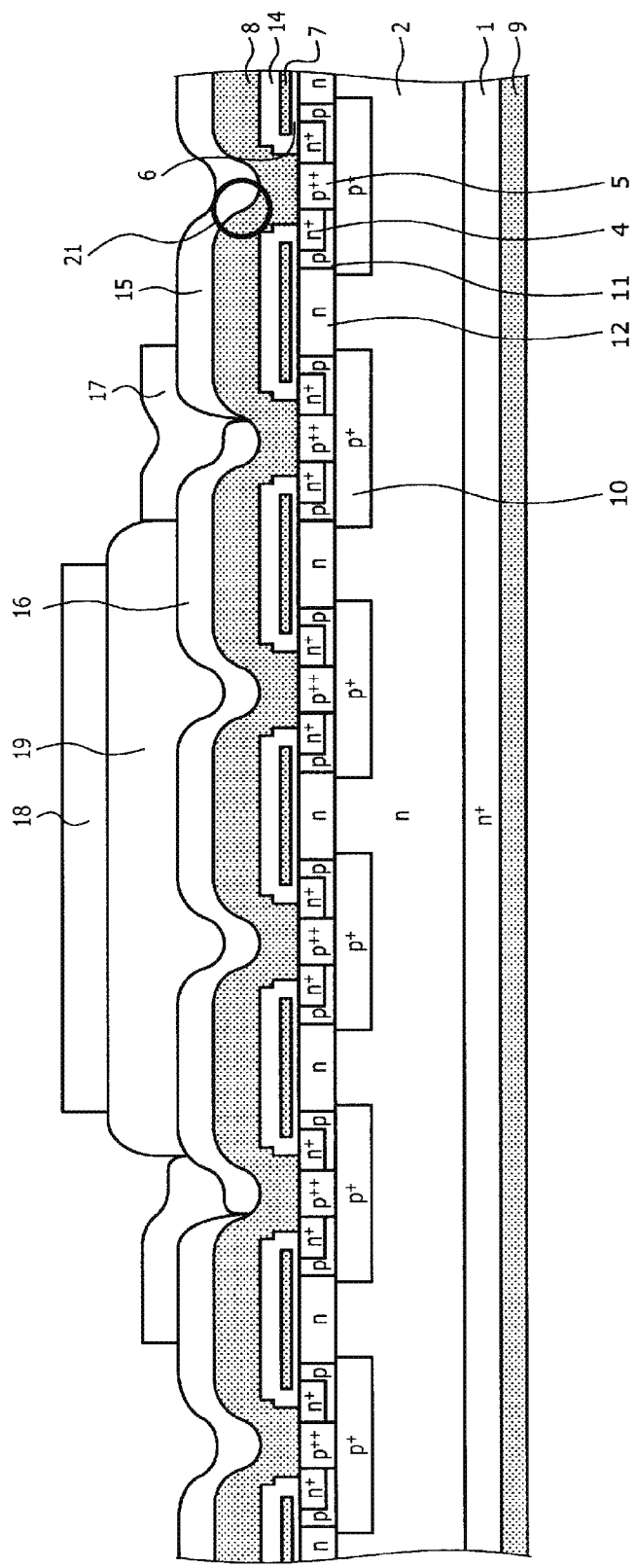
FIG. 5 is a cross-sectional view illustrating a configuration of a conventional silicon carbide semiconductor device.

In the stress reduction region 100, one of the p$^+$ regions 10 is formed in the surface of the n-type silicon carbide epitaxial layer 2, and only one of the p$^{++}$ contact regions 5 is formed in the p-type silicon carbide epitaxial layer 11 on that p$^+$ region 10. In other words, no n$^+$ source regions 4, n-type well regions 12, or gate electrodes 7 are formed in the stress reduction region 100. Therefore, in the stress reduction region 100, the source electrode 8 does not cover the gate electrodes 7, and no level differences 21 (see FIG. 2 and FIG. 5) are present in the source electrode 8. As a result, the boundaries between the protective film 15 and the plating film 16 rest on the flat surface of the source electrode 8 in the stress reduction region 100.

Furthermore, because no n$^+$ source regions 4 or n-type well regions 12 are formed in the stress reduction region 100, no channels are formed and no drift current flows in this region. In this way, the stress reduction region 100 is an inactive region that does not function as a semiconductor device. However, the stress reduction region 100 does function as a contact region for the pin electrode 18. Because the region for forming the pin electrode 18 has a smaller area than would a region to which bonding wires would be bonded using a wire bonding process, the inactive region constituted by the stress reduction region 100 has a smaller area than would a region to which bonding wires would be bonded. Moreover, the size of the plating region must increase as the semiconductor device chip size increases, which increases the magnitude of the concentrated stress applied at the level differences 21 in the source electrode 8. Therefore, the larger the semiconductor device chip size, the greater the effect of the present invention.

A second protective film 17 is formed selectively covering the portions where the plating film 16 and the protective film 15 contact one another. The second protective film 17 covers the gaps between the plating film 16 and the protective film 15 and prevents solder 19 or the like from infiltrating towards the substrate side, for example. The second protective film 17 also functions as a mask when forming the solder 19. Moreover, the second protective film 17 may cover the entire surface of the protective film 15. Furthermore, the pin electrode 18 is formed connected to the plating film 16 via the solder 19. The pin electrode 18 is a wiring material for extracting voltage from the source electrode 8 to outside of the device. The pin electrode 18 is pin-shaped and is bonded to the source electrode 8 in an upright manner.

(Method of Manufacturing Silicon Carbide Semiconductor Device According to Embodiment 1)

Next, a method of manufacturing the silicon carbide semiconductor device according to an embodiment will be described using an example of manufacturing a MOSFET in the 1200V breakdown voltage class, for example. First, an $n^+$ silicon carbide substrate 1 doped with nitrogen to an impurity concentration of $2 \times 10^{19}$ cm$^{-3}$, for example, is prepared. The principal surface of the $n^+$ silicon carbide substrate 1 may be a (000-1) plane having an off-angle of approximately 4° in the <11-20> direction, for example.

Next, an n-type silicon carbide epitaxial layer 2 that is doped with nitrogen to an impurity concentration of $1.0 \times 10^{16}$ cm$^{-3}$ and has a thickness of 10 μm is epitaxially grown on this (000-1) plane of the $n^+$ silicon carbide substrate 1.

Then, a mask that is made of a resist, for example, and has the desired openings formed therein using a photolithography technology is formed on the surface of the n-type silicon carbide epitaxial layer 2. Here, a mask that has an opening in a stress reduction region 100 beneath a plating film 16 that will be formed later is used. Next, using an ion implantation method with the resist mask being used as a mask, p-type impurities such as aluminum atoms are ion-implanted. In this way, $p^+$ regions 10 are formed in portions of the surface region of the n-type silicon carbide epitaxial layer 2. Then, the mask used during the ion implantation process for forming the $p^+$ regions 10 is removed.

Next, a p-type silicon carbide epitaxial layer 11 is epitaxially grown to a thickness of 0.5 μm, for example, on the surface of the n-type silicon carbide epitaxial layer 2. Here, the p-type silicon carbide epitaxial layer 11 may be epitaxially grown while doping with aluminum to an impurity concentration of $2.0 \times 10^{16}$ cm$^{-3}$, for example.

Next, a mask that is made of a resist, for example, and has the desired openings formed therein using a photolithography technology is formed on the surface of the p-type silicon carbide epitaxial layer 11. Here, a mask that does not have an opening in the stress reduction region 100 beneath the plating film 16 that will be formed later is used. Then, using an ion implantation method with the resist mask being used as a mask, n-type impurities such as nitrogen are ion-implanted. In this way, $n^+$ source regions 4 are formed in portions of the surface region of the p-type silicon carbide epitaxial layer 11. Then, the mask used during the ion implantation process for forming the $n^+$ source region 4 is removed.

Next, a mask that is made of a resist, for example, and has the desired openings formed therein using a photolithography technology is formed on the surface of the p-type silicon carbide epitaxial layer 11. Here, a mask that has an opening in the stress reduction region 100 beneath the plating film 16 that will be formed later is used. Then, using an ion implantation method with the resist mask being used as a mask, p-type impurities such as aluminum are ion-implanted. In this way, $p^{++}$ contact regions 5 are formed in portions of the surface region of the p-type silicon carbide epitaxial layer 11. Then, the mask used during the ion implantation process for forming the $p^{++}$ contact regions 5 is removed.

Next, a mask that is made of a resist, for example, and has the desired openings formed therein using a photolithography technology is formed on the surface of the p-type silicon carbide epitaxial layer 11. Here, a mask that does not have an opening in the stress reduction region 100 beneath the plating film 16 that will be formed later is used. Then, using an ion implantation method with the resist mask being used as a mask, n-type impurities such as nitrogen are ion-implanted. In this way, n-type well regions 12 are formed in portions of the surface region of the p-type silicon carbide epitaxial layer 11. Then, the mask used during the ion implantation process for forming the n-type well regions 12 is removed.

Next, a heat treatment (annealing) for activating the $n^+$ source regions 4, the $p^{++}$ contact regions 5, and the n-type well regions 12 is performed. The temperature and duration of this heat treatment may be 1620° C. and 2 minutes, respectively.

The order in which the $n^+$ source regions 4, the $p^{++}$ contact regions 5, and the n-type well regions 12 are formed can be changed in various ways.

Next, the front surface side of the silicon carbide semiconductor substrate is thermally oxidized to form a gate insulating film 6 with a thickness of 100 nm. This thermal oxidation process may be performed by applying a heat treatment at a temperature of approximately 1000° C. in a mixed atmosphere of oxygen ($O_2$) and hydrogen ($H_2$). In this way, the regions formed in the surfaces of the p-type silicon carbide epitaxial layer 11 and the n-type silicon carbide epitaxial layer 2 are covered by the gate insulating film 6.

Next, a polycrystalline silicon layer that is doped with phosphorus (P), for example, and will become gate electrodes 7 is formed on the gate insulating film 6. Then, the polycrystalline silicon layer is selectively removed using a patterning process, thereby leaving the polycrystalline silicon layer remaining on the portions of the p-type silicon carbide epitaxial layer 11 that are sandwiched between the $n^+$ source regions 4 and the n-type well regions 12. Here, the polycrystalline silicon layer may also be left remaining on the n-type well regions 12.

Next, a phosphosilicate glass (PSG) film with a thickness of 1.0 μm, for example, is formed covering the gate electrodes 7 as an interlayer insulating film 14. The interlayer insulating film 14 and the gate insulating film 6 are then selectively removed using a patterning process. For example, the portions of the interlayer insulating film 14 and the gate insulating film 6 on the $n^+$ source regions 4 and the $p^{++}$ contact regions 5 are removed to form contact holes, thereby exposing the $n^+$ source regions 4 and the $p^{++}$ contact regions 5. Moreover, when forming these contact holes, the portions of the interlayer insulating film 14 and the gate insulating film 6 in the stress reduction region 100 are also removed to expose the p$^{++}$ contact region 5 therebeneath. Then, a heat treatment (reflow) is performed to planarize the interlayer insulating film 14.

Next, a source electrode 8 is formed as a film using sputtering. The source electrode 8 is then patterned using a photolithography and etching process. Here, the source electrode 8 fills the contact holes, thereby bringing the source electrode 8 into contact with the n$^+$ source regions 4 and the p$^{++}$ contact regions 5. In the stress reduction region 100, no gate electrodes 7 are formed, and therefore no level differences 21 occur in the source electrode 8. The portions of the source electrode 8 on the interlayer insulating film 14 may have a thickness of 5 µm, for example. Moreover, the source electrode 8 may be made of aluminum that contains 1% silicon (Al—Si), for example.

Next, a nickel film, for example, is formed on the surface of the n$^+$ silicon carbide substrate 1 (that is, on the rear surface of the silicon carbide semiconductor substrate) as a drain electrode 9. Then, a heat treatment is performed at a temperature of 970° C., for example, to form an ohmic contact between the n$^+$ silicon carbide substrate 1 and the drain electrode 9.

Next, titanium (Ti), nickel (Ni), and gold (Au) films, for example, are formed in that order on the surface of the nickel film as part of the drain electrode 9. Then, a protective film 15 such as a polyimide passivation film is selectively formed on the source electrode 8 on the front surface side of the silicon carbide semiconductor substrate.

Next, using the protective film 15 as a mask, the plating film 16 is selectively formed on the portions of the source electrode 8 where the protective film 15 is not present. In this way, the plating film 16 is formed on the source electrode 8 without the plating material flowing into prescribed locations. Here, "prescribed locations" refers to regions outside of the stress reduction region 100. Next, using a polyimide film made of a polymer resin containing an imide bond, or the like, a second protective film 17 is selectively formed covering the portions where the plating film 16 and the protective film 15 are adjacent to one another, for example.

Then, a pin electrode 18 is formed connected to the plating film 16 via solder 19, using the protective film 15 and the second protective film 17 as a mask while applying the solder. This completes the MOSFET illustrated in FIG. 1.

In Embodiment 1 as described above, the width of the plating film formed on the source electrode is set to 10 µm or greater. Beneath the plating film, the first and second regions of the first conductivity type are not formed, and only the p$^{++}$ contact region is formed. Due to this, gate electrodes are not present directly beneath the triple point portions at which the plating film, the protective film, and the source electrode contact one another, and therefore no level differences are present in the source electrode. As a result, there are no portions at which stress is concentrated when soldering the pin electrode or when switching the semiconductor device, and therefore no cracking occurs, and the microcurrent threshold voltage does not fluctuate due to such stress. This makes it possible to prevent decreases in the reliability of the semiconductor device. Here, "microcurrent" refers to the current that flows while the drain current is still small when the drain-source voltage is increased from 0 and the drain current increases linearly proportional to the drain-source voltage.

Moreover, directly beneath the triple point portions, only the p$^{++}$ contact region is formed, and no channels form. Therefore, the microcurrent threshold voltage does not fluctuate even if cracking occurs due to stress concentration. Furthermore, because no channels form, the microcurrent threshold voltage does not fluctuate due to applied stress even if stress does get concentrated. This makes it possible to prevent decreases in the reliability of the semiconductor device.

Embodiment 2

Figure 2:
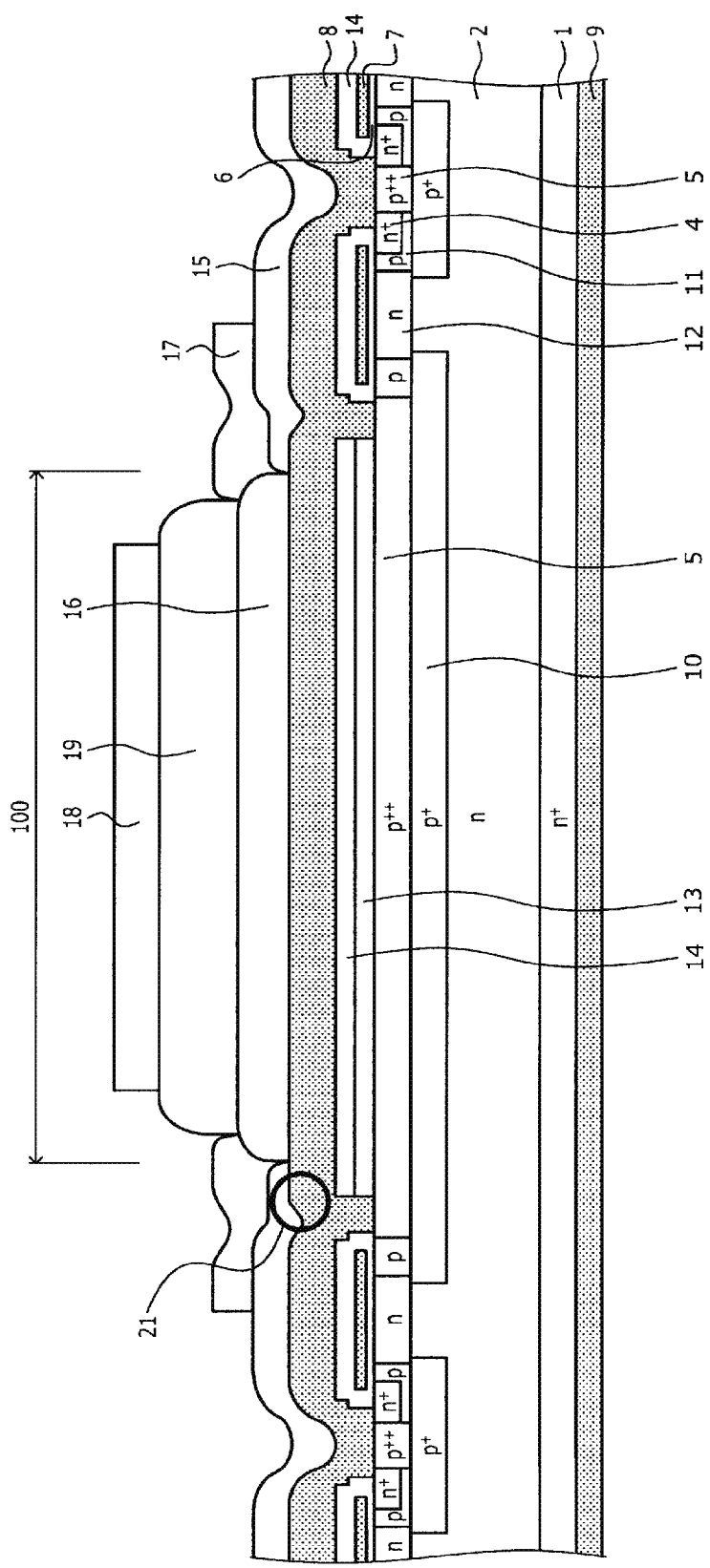
FIG. 2 is a cross-sectional view illustrating a configuration of a silicon carbide semiconductor device according to Embodiment 2.

FIG. 2 is a cross-sectional view illustrating a configuration of a silicon carbide semiconductor device according to Embodiment 2. The semiconductor device according to Embodiment 2 is different than the semiconductor device according to Embodiment 1 in that an insulating film 13 and an interlayer insulating film 14 are formed in that order between a p$^{++}$ contact region 5 and a source electrode 8 in a stress reduction region 100.

Forming the insulating film 13 and the interlayer insulating film 14 keeps level differences 21 in a source electrode 8 less than or equal to 2 µm (and preferably, substantially equal to zero), thereby facilitating planarization of the entire surface of the source electrode 8. For example, setting the total thickness of the insulating film 13 and the interlayer insulating film 14 to less than or equal to 2 µm makes it possible to keep the level differences 21 in the source electrode 8 less than or equal to 2 µm.

Moreover, although FIG. 2 depicts a case in which both the insulating film 13 and the interlayer insulating film 14 are formed, just the interlayer insulating film 14 may be formed. In this case, setting the thickness of the interlayer insulating film 14 to less than or equal to 2 µm makes it possible to keep the level differences 21 in the source electrode 8 less than or equal to 2 µm. Setting the total thickness of the insulating film 13 and the interlayer insulating film 14 to less than or equal to 2 µm or setting the thickness of the interlayer insulating film 14 to less than or equal to 2 µm ensures that the boundaries between the protective film 15 and the plating film 16 rest on the flat surface of the source electrode 8 in the stress reduction region 100.

(Method of Manufacturing Silicon Carbide Semiconductor Device According to Embodiment 2)

Next, a method of manufacturing the semiconductor device according to Embodiment 2 will be described. First, the step of forming an n-type silicon carbide epitaxial layer 2 to the step of forming an interlayer insulating film 14 are performed in order the same as in Embodiment 1. Here, however, a portion of a gate insulating film 6 formed by thermally oxidizing the front surface side of a silicon carbide semiconductor substrate is left remaining in a stress reduction region 100 as an insulating film 13.

Next, the interlayer insulating film 14 and the gate insulating film 6 are selectively removed using a patterning process to form contact holes, thereby exposing n$^+$ source regions 4 and p$^{++}$ contact regions 5. Here, the portions of the interlayer insulating film 14 and the gate insulating film 6 in the stress reduction region 100 are not removed in the patterning process.

Next, the step of performing a heat treatment (reflow) and the subsequent steps are performed in order the same as in Embodiment 1, thereby completing the MOSFET illustrated in FIG. 2.

The silicon carbide semiconductor device and the method of manufacturing the silicon carbide semiconductor device according to Embodiment 2 as described above make it possible to achieve the same advantageous effects as in the silicon carbide semiconductor device and the method of manufacturing the silicon carbide semiconductor device according to Embodiment 1.

Moreover, in the semiconductor device and the method of manufacturing the semiconductor device according to Embodiment 2, forming the insulating film and the interlayer insulating film makes it possible to keep the level differences in the source electrode less than or equal to 2 μm. Keeping the level differences in the source electrode small reduces the stress that concentrates at those level differences in the source electrode. Therefore, no cracking occurs, and the microcurrent threshold voltage does not fluctuate due to applied stress. This makes it possible to prevent decreases in the reliability of the semiconductor device.

Embodiment 3

Figure 3:
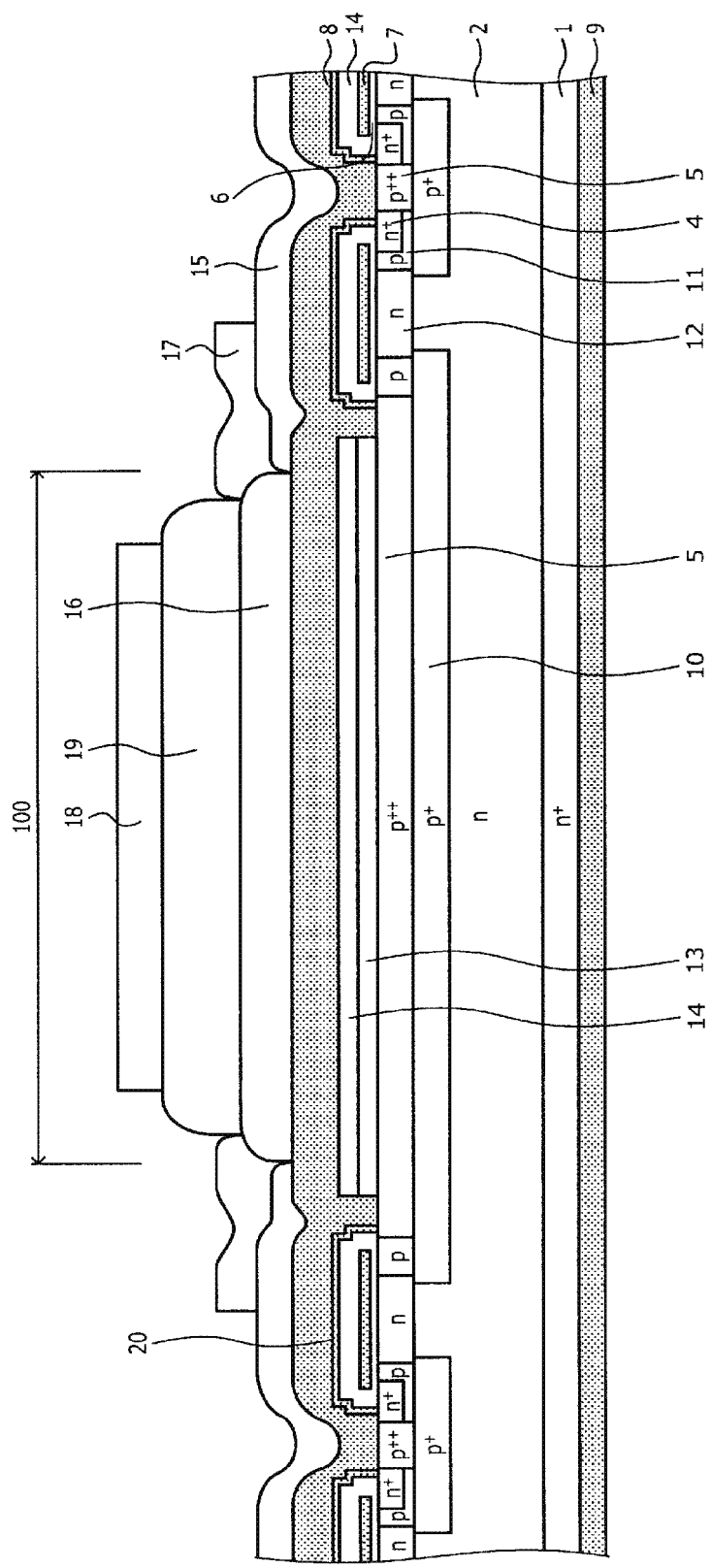
FIG. 3 is a cross-sectional view illustrating a configuration of a silicon carbide semiconductor device according to Embodiment 3.

FIG. 3 is a cross-sectional view illustrating a configuration of a silicon carbide semiconductor device according to Embodiment 3. The semiconductor device according to Embodiment 3 is different from the semiconductor device according to Embodiment 2 in that a nitride film 20 ($Si_3N_4$) is formed covering an interlayer insulating film 14.

The nitride film 20 is a protective film that has lower water absorptivity than a polyimide used for a protective film 15. Forming the nitride film 20 covering the interlayer insulating film 14 makes it possible to prevent water from infiltrating into regions near a gate insulating film.

(Method of Manufacturing Silicon Carbide Semiconductor Device According to Embodiment 3)

Next, a method of manufacturing the semiconductor device according to Embodiment 3 will be described. First, the step of forming an n-type silicon carbide epitaxial layer 2 to the step of performing a heat treatment (reflow) to planarize an interlayer insulating film 14 are performed in order the same as in Embodiment 2.

Next, a nitride film 20 is formed covering the interlayer insulating film 14 that covers gate electrodes 7. Here, the gate electrodes 7 are not present in a stress reduction region 100, and therefore the nitride film 20 may be formed not covering the interlayer insulating film 14 in the stress reduction region 100.

Next, the step of forming a source electrode 8 and the subsequent steps are performed in order the same as in Embodiment 2, thereby completing the MOSFET illustrated in FIG. 3.

The silicon carbide semiconductor device and the method of manufacturing the silicon carbide semiconductor device according to Embodiment 3 as described above make it possible to achieve the same advantageous effects as in the silicon carbide semiconductor device and the method of manufacturing the silicon carbide semiconductor device according to Embodiment 2.

Moreover, in the semiconductor device and the method of manufacturing the semiconductor device according to Embodiment 3, the nitride film has lower water absorptivity than the polyimide protective film. Therefore, forming the nitride film on the interlayer insulating film makes it possible to prevent water from infiltrating into regions near the gate insulating film. This makes it possible to prevent deterioration in performance and decreases in reliability in the semiconductor device.

Furthermore, in Embodiment 3, the nitride film 20 covers the interlayer insulating film 14 in the silicon carbide semiconductor device according to Embodiment 2. However, the nitride film 20 can also be formed covering the interlayer insulating film 14 in the silicon carbide semiconductor device according to Embodiment 1. This configuration makes it possible to achieve the same advantageous effects as in the silicon carbide semiconductor device and the method of manufacturing the silicon carbide semiconductor device according to Embodiment 1.

Embodiment 4

Figure 4:
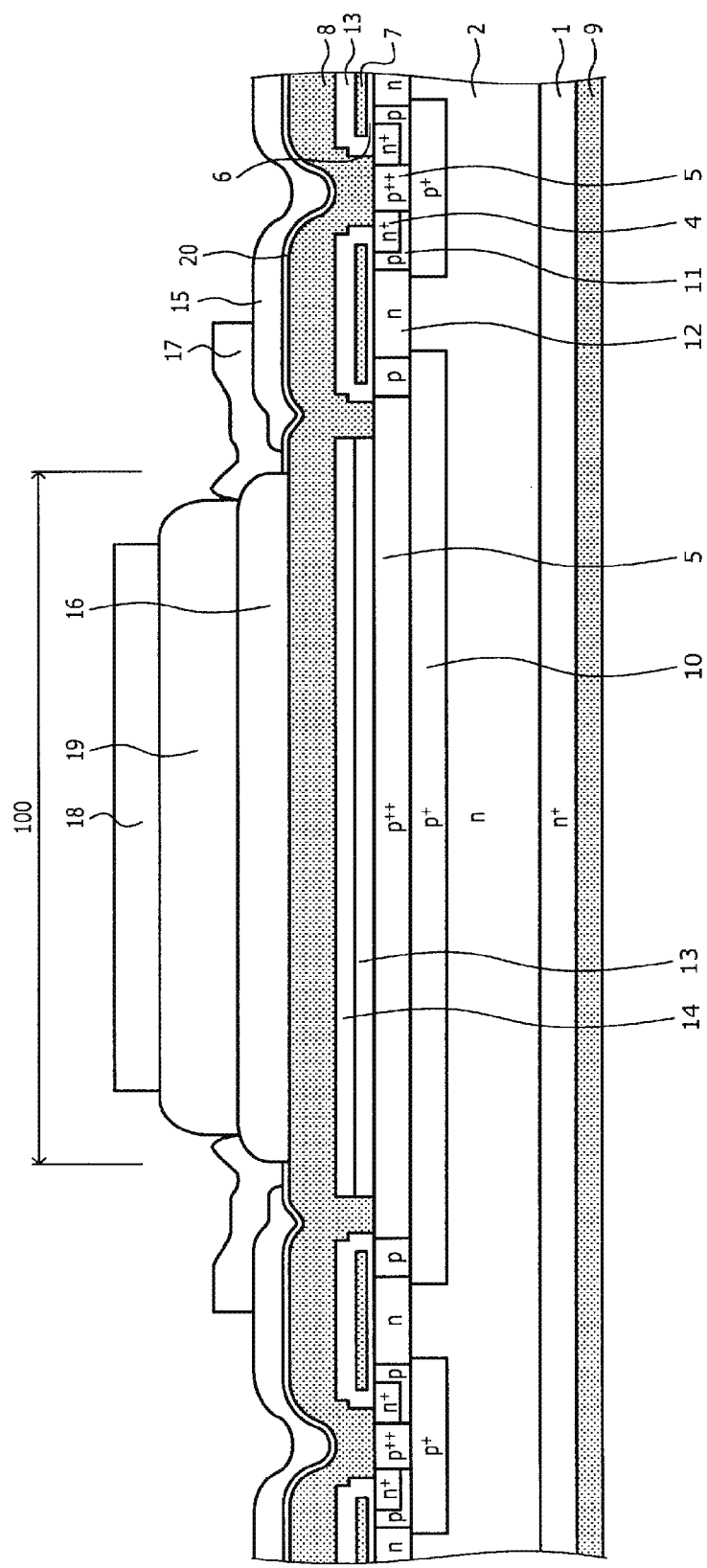
FIG. 4 is a cross-sectional view illustrating a configuration of a silicon carbide semiconductor device according to Embodiment 4.

FIG. 4 is a cross-sectional view illustrating a configuration of a silicon carbide semiconductor device according to Embodiment 4. The semiconductor device according to Embodiment 4 is different than the semiconductor device according to Embodiment 2 in that a nitride film 20 is formed covering a source electrode 8.

Covering the source electrode 8 (which contains aluminum and is therefore prone to corrosion) with the nitride film 20 makes it possible to prevent water from infiltrating into regions near a gate insulating film 6. Moreover, a plating film 16 is less prone to corrosion than aluminum, and therefore the nitride film 20 may be formed not covering the portion of the source electrode 8 covered by the plating film 16.

(Method of Manufacturing Silicon Carbide Semiconductor Device According to Embodiment 4)

Next, a method of manufacturing the semiconductor device according to Embodiment 4 will be described. First, the step of forming an n-type silicon carbide epitaxial layer 2 to the step of forming a source electrode 8 are performed in order the same as in Embodiment 2.

Then, a nitride film 20 is selectively formed on the source electrode 8 on the front surface side of the silicon carbide semiconductor substrate, and a protective film 15 is selectively formed on the nitride film 20. The nitride film 20 is formed protruding out from the protective film 15 and contacting a plating film 16.

Next, the step of forming a drain electrode 9, the step of selectively forming a second protective film 17, and the subsequent steps are performed in order the same as in Embodiment 2, thereby completing the MOSFET illustrated in FIG. 4.

The silicon carbide semiconductor device and the method of manufacturing the silicon carbide semiconductor device according to Embodiment 4 as described above make it possible to achieve the same advantageous effects as in the silicon carbide semiconductor device and the method of manufacturing the silicon carbide semiconductor device according to Embodiment 2.

Moreover, in the semiconductor device and the method of manufacturing the semiconductor device according to Embodiment 4, partially forming the nitride film on the source electrode makes it possible to prevent water from infiltrating from the source electrode into regions near the gate insulating film. This makes it possible to prevent deterioration in performance and decreases in reliability in the semiconductor device.

Furthermore, in Embodiment 4, the nitride film covers the source electrode in the silicon carbide semiconductor device according to Embodiment 2. However, the nitride film can also be formed covering the source electrode in the silicon carbide semiconductor device according to Embodiment 1. This configuration makes it possible to achieve the same advantageous effects as in the silicon carbide semiconductor device and the method of manufacturing the silicon carbide semiconductor device according to Embodiment 1.

The embodiments of the present invention were described using MOSFETs as an example. However, the present invention is not limited to this example and may be applied to semiconductor devices of various configurations, including MOS semiconductor devices such as IGBTs, semiconductor devices in which concentrated stress is applied to the device structure due to level differences in the source electrode, and the like. Moreover, in the embodiments described above, silicon carbide was used as the wide-bandgap semiconductor as an example. However, the same advantageous effects can also be achieved when using a wide-bandgap semiconductor other than silicon carbide such as gallium nitride (GaN). Furthermore, in the embodiments described above, the first conductivity type was n-type and the second conductivity type was p-type. However, the present invention still exhibits all of the same advantageous effects if the first conductivity type is p-type and the second conductivity type is n-type.

INDUSTRIAL APPLICABILITY

As described above, the semiconductor device according to the present invention is suitable for use in high breakdown voltage semiconductor devices used in power converters, power supplies for various types of industrial machinery, or the like. The present invention is particularly well-suited for application to silicon carbide semiconductor devices that use pin electrodes as a wiring material for extracting voltage from the front surface electrode.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
a wide-bandgap semiconductor substrate of a first conductivity type made of a semiconductor having a wider bandgap than silicon;
a wide-bandgap semiconductor deposition layer of the first conductivity type that is deposited on a front surface of the wide-bandgap semiconductor substrate and that has a lower impurity concentration than the wide-bandgap semiconductor substrate;
a semiconductor region of a second conductivity type that is selectively formed in a surface layer of the wide-bandgap semiconductor deposition layer on a side opposite to the wide-bandgap semiconductor substrate;
a wide-bandgap semiconductor layer of the second conductivity type that is made of a semiconductor having a wider bandgap than silicon and that is formed on surfaces of the wide-bandgap semiconductor deposition layer and the semiconductor region of the second conductivity type;
a first region of the first conductivity type selectively formed in a portion of the wide-bandgap semiconductor layer that is above the deposition layer;
a second region of the first conductivity type that is selectively formed in the wide-bandgap semiconductor layer;
a gate electrode formed on a surface of a portion of the wide-bandgap semiconductor layer that is sandwiched between the second region of the first conductivity type and the first region of the first conductivity type;
a gate insulating film interposed between the gate electrode and the wide-bandgap semiconductor layer;
a source electrode that contacts the wide-bandgap semiconductor layer and the second region of the first conductivity type;
an interlayer insulating film that covers the gate electrode;
a drain electrode formed on a rear surface of the wide-bandgap semiconductor substrate;
a plating film selectively formed on the source electrode; and
a pin electrode that is connected to the plating film via solder,
wherein a width of the plating film in a direction parallel to the wide-bandgap semiconductor substrate is greater than or equal to 10 µm, and
wherein the second region of the first conductivity type and the first region of the first conductivity type are not formed in a portion of the wide-bandgap semiconductor layer facing the plating film.

2. The semiconductor device according to claim 1,
wherein the source electrode has a bump-shaped portion, and
wherein a difference in height, from the front surface of the wide-bandgap semiconductor substrate, of said bump-shaped portion is less than or equal to 2 µm.

3. The semiconductor device according to claim 1, wherein the interlayer insulating film is covered by a nitride film.

4. The semiconductor device according to claim 1, wherein the source electrode is selectively covered by a nitride film.

5. A method of manufacturing a semiconductor device, comprising:
forming, on a front surface of a wide-bandgap semiconductor substrate of a first conductivity type made of a semiconductor having a wider bandgap than silicon, a wide-bandgap semiconductor deposition layer of the first conductivity type that has a lower impurity concentration than the wide-bandgap semiconductor substrate;
selectively forming, in a surface layer of the wide-bandgap semiconductor deposition layer, a semiconductor region of a second conductivity type;
forming, on surfaces of the wide-bandgap semiconductor deposition layer, a wide-bandgap semiconductor layer of the second conductivity type that is made of a semiconductor having a wider bandgap than silicon;
selectively forming, in a portion of the wide-bandgap semiconductor layer that is above the deposition layer, a first region of the first conductivity type;
selectively forming a second region of the first conductivity type in the wide-bandgap semiconductor layer;
forming a gate electrode on a surface of a portion of the wide-bandgap semiconductor layer that is sandwiched between the second region of the first conductivity type and the first region of the first conductivity type;
forming a gate insulating film between the gate electrode and the wide-bandgap semiconductor layer;
forming a source electrode that contacts the wide-bandgap semiconductor layer and the second region of the first conductivity type;
forming an interlayer insulating film that covers the gate electrode;
forming a drain electrode on a rear surface of the wide-bandgap semiconductor substrate;
selectively forming a plating film on the source electrode; and forming a pin electrode that is connected to the plating film via solder,
wherein in the step of forming the plating film, the plating film is formed having a width of greater than or equal to 10 µm in a direction parallel to the wide-bandgap semiconductor substrate,
wherein in the step of selectively forming the first region of the first conductivity type, the first region of the first conductivity type is not formed in a portion of the wide-bandgap semiconductor layer that faces the plating film, and
wherein in the step of selectively forming the second region of the first conductivity type, the second region of the first conductivity type is not formed in a portion of the wide-bandgap semiconductor layer that faces the plating film.

* * * * *